United States Patent
Ono et al.

(10) Patent No.: US 7,887,609 B2
(45) Date of Patent: Feb. 15, 2011

(54) POLISHING SLURRY FOR POLISHING ALUMINUM FILM AND POLISHING METHOD FOR POLISHING ALUMINUM FILM USING THE SAME

(75) Inventors: Hiroshi Ono, Hitachinaka (JP); Toranosuke Ashizawa, Hitachinaka (JP); Yasuo Kamigata, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 835 days.

(21) Appl. No.: 11/602,503

(22) Filed: Nov. 21, 2006

(65) Prior Publication Data

US 2007/0141957 A1 Jun. 21, 2007

(30) Foreign Application Priority Data

Nov. 22, 2005 (JP) ............................. P2005-336938
Sep. 26, 2006 (JP) ............................. P2006-260709

(51) Int. Cl.
*B24D 3/02* (2006.01)
*C09C 1/68* (2006.01)
*C09K 3/14* (2006.01)
*B24B 1/00* (2006.01)
*B24B 9/00* (2006.01)
*C09G 1/02* (2006.01)

(52) U.S. Cl. ................................. 51/308; 451/41; 106/3
(58) Field of Classification Search ................... 51/308; 451/41; 106/3
See application file for complete search history.

(56) References Cited

U.S. PATENT DOCUMENTS 4,944,836 A 7/1990 Beyer et al.
6,527,818 B2 3/2003 Hattori et al.
6,568,997 B2 * 5/2003 Costas et al. ................... 451/41
6,569,215 B2 * 5/2003 Miyata ......................... 51/307

FOREIGN PATENT DOCUMENTS

JP 2002-080827 A 3/2002
JP 2002-80827 A 3/2002

OTHER PUBLICATIONS

Chinese Office Action dated Jan. 9, 2009, issued in corresponding Chinese Patent Application No. 2006-800431006.
International Search Report in PCT/JP2006/322650 issued by ISA/JP on Dec. 12, 2006; PCT ISA 210, pp. 1-2.
Written Opinion in PCT/JP2006/322650 issued by ISA/JP on Dec. 12, 2006; PCT/ISA/237, 3 pgs.
Notification of Transmittal of Translation of the International Preliminary Report on Patentability (Form PCT/IB/338) of International Application No. PCT/JP2006/322650 mailed Jun. 19, 2008 with Forms PCT/IB/373 and PCT/ISA/237.
F.B. Kaufman et al.; "Chemical-Mechanical Polishing for Fabricating Patterned W Metal Features as Chip Interconnects", Journal of the Electrochemical Society, vol. 138, No. 11, 1991, pp. 3460-3465.
Korean Office Action, issued Apr. 30, 2010 for corresponding Korean Patent Application No. 10-2008-7011430.
Korean Office Action dated Nov. 24, 2010, issued in corresponding Korean Patent Application No. 10-2008-7011430.

* cited by examiner

*Primary Examiner*—Anthony J Green
*Assistant Examiner*—Pegah Parvini
(74) *Attorney, Agent, or Firm*—Westerman, Hattori, Daniels & Adrian, LLP

(57) ABSTRACT

A polishing slurry for polishing an aluminum film used for LSI or the like and a method for polishing an aluminum film using the same are provided. A polishing slurry for polishing an aluminum film comprising a polyvalent carboxylic acid having a first stage acid dissociation exponent at 25° C. of 3 or lower, colloidal silica, and water, and having a pH from 2 to 4, and a polishing method for polishing an aluminum film using the polishing slurry.

12 Claims, No Drawings

POLISHING SLURRY FOR POLISHING ALUMINUM FILM AND POLISHING METHOD FOR POLISHING ALUMINUM FILM USING THE SAME

BACKGROUND OF THE INVENTION

1. Field of the Invention

The invention relates to a polishing slurry for polishing an aluminum film and a polishing method for polishing an aluminum film using the same, and particularly relates to a polishing slurry for polishing an aluminum film used for forming damascene wirings in semiconductor integrated circuits (hereinafter referred to as LSI) and a method for polishing an aluminum film using the same.

2. Description of the Related Art

In recent years, along with high integration and high performance LSI, new techniques for fine patterning have been developed. A chemical mechanical polishing (hereinafter referred to as CMP) process is one of them, and is a frequently used technique in the LSI manufacturing process, particularly in the planarization of interlayer insulating films, formation of metal plugs, and formation of buried wirings (damascene wirings) in the multilayer wiring formation process. The technique is, for example, disclosed in U.S. Pat. No. 4,944,836.

The damascene wiring technique allows to simplify the wiring process and improve yields and reliability, and the application of the technique will be expanded in future. At present, as a wiring metal used for damascene wirings, copper having low resistance is mainly used for high-speed logic devices, and inexpensive aluminum or tungsten is used for memory devices such as DRAM.

However, in either devices, aluminum, which has second lowest resistance following copper, is attracting attention as a wiring metal in consideration of its low resistance and low cost.

In a common method of metal CMP for polishing a metal film, a polishing pad is attached to a circular polishing table (platen), the surface of the polishing pad is moistened with a polishing slurry, the substrate surface having a metal film formed thereon is pressed against the polishing pad, and the polishing table is rotated while a specified pressure (hereinafter referred to as polishing pressure) is applied from the backside of the substrate to remove the metal film in the convex parts through mechanical friction between the polishing slurry and the convex parts of the metal film.

The polishing slurry used in CMP usually comprises an oxidant and abrasive, to which a metal oxide solubilizer is further added as necessary. The basic mechanism of CMP by the polishing slurry for CPM is considered as follows: the surface of a metal film is oxidized by the oxidizer, and the resulting oxide layer is shaven off by the abrasive.

The oxide layer on the metal surface in the concave parts has almost no contact with the polishing pad, so that the abrasive has no shaving effect on that oxide layer. Therefore, along with the progress of CMP, the metal layer on the convex parts is removed and the surface of the substrate is planarized. The details of this mechanism are disclosed in Journal of Electrochemical Society, Vol. 138, No. 11 (issued in 1991), pp. 3460-3464.

In CMP, high-speed polishing of metal films, evenness of the polished surface, and low defect density on the polished surface are required.

Since an aluminum film is softer than other metal films for damascene wirings such as a copper film or tungsten film, it can be polished at a high speed, but when subjected to CMP using a polishing slurry containing a relatively hard polishing abrasive such as alumina particles, among the defects on the polished surface, particularly surface roughness is increased to impair the smoothness and significantly deteriorate the wiring yield.

Thus, to the recent demand for higher quality in LSI, it was difficult with the conventional techniques to polish the surface of an aluminum film to a sufficient smoothness and at a high speed.

SUMMARY OF THE INVENTION

The invention provides a polishing slurry for smoothly and quickly polishing an aluminum film used for LSI or the like and a method for polishing an aluminum film using the same.

The invention relates to (1) a polishing slurry for polishing an aluminum film comprising a polyvalent carboxylic acid having a first stage acid dissociation exponent at 25° C. of 3 or lower, colloidal silica, and water, and having a pH from 2 to 4.

Further, the invention relates to (2) a polishing slurry for polishing an aluminum film as described in (1) wherein the polyvalent carboxylic acid is at least one selected from oxalic acid, malonic acid, and tartaric acid.

Further, the invention relates to (3) a polishing slurry for polishing an aluminum film as described in (1) wherein the average particle diameter of the secondary particles of the colloidal silica is from 5 to 100 nm.

Further, the invention relates to (4) a polishing slurry for polishing an aluminum film as described in any one of (1) through (3) wherein an oxidizing agent is further comprised.

Further, the invention relates to (5) a polishing slurry for polishing an aluminum film as described in (4) wherein the oxidizing agent is at least one selected from hydrogen peroxide, nitric acid, potassium periodate, hypochlorous acid, and ozone water.

Further, the invention relates to (6) a method for polishing an aluminum film comprising pressing a substrate having an aluminum film formed thereon against a polishing cloth on a polishing table, and moving the substrate and the polishing table while the polishing slurry for polishing an aluminum film as described in any one of (1) through (5) is supplied between the film and the polishing cloth, thereby polishing the aluminum film.

The use the polishing slurry of the invention for polishing an aluminum film allows to smoothly and quickly polish the surface of an aluminum film. This contributes to the improvement of the quality of LSI or the like using an aluminum film.

Disclosure of the present description is related to the subjects included in Japanese Patent Application No. 2005-336938 (filed on Nov. 22, 2005) and Japanese Patent Application No. 2006-260709 (filed on Sep. 26, 2006), and these applications are entirely incorporated into this description as references.

DETAILED DESCRIPTION OF THE PREFERRED EMBODIMENTS

The polishing slurry of the invention for polishing an aluminum film comprises a polyvalent carboxylic acid having a first stage acid dissociation exponent at 25° C. of 3 or lower, colloidal silica, and water, and has a pH from 2 to 4.

The polyvalent carboxylic acid used in the invention is a carboxylic acid having two or more carboxyl groups within one molecule, and is preferably a dicarboxylic acid. The first stage acid dissociation exponent (pKa1) of the polyvalent carboxylic acid at 25° C. is 3 or less, preferably 2.95 or less, and further preferably 2.90 or less. When the polyvalent carboxylic acid has a first stage acid dissociation exponent (pKa1) at 25° C. exceeding 3, the polishing rate is so low that the object of the invention cannot be achieved. Examples of the polyvalent carboxylic acid include oxalic acid, malonic acid, tartaric acid, maleic acid, citric acid, and ammonium salts thereof, and these may be a hydrate. Among them, oxalic acid, malonic acid, and tartaric acid are preferable in that they achieve a practical polishing rate, and oxalic acid is particularly preferable. These polyvalent carboxylic acids may be used alone or in combination of two or more of them. The acid dissociation exponent (pKa) in the invention refers to the logarithm of the reciprocal of the acid dissociation constant, and is described in detail in, for example, "Kagaku Binran Kisohen (Handbook of Chemistry, Basic Part)", 4th ed., (published on Sep. 30, 1993, Maruzen Co., Ltd., II, pp. 317-321.

The blending quantity of the above-described polyvalent carboxylic acid in the polishing slurry of the invention for polishing an aluminum film is preferably 0.0001 to 0.05 mol, and more preferably 0.001 to 0.01 mol relative to the total weight 100 g of the polishing slurry. When the blending quantity exceeds 0.05 mol, the smoothness of the polished aluminum film tends to be deteriorated, and when less than 0.0001 mol, the polishing rate of the aluminum film tends to be insufficient.

For the sake of increasing the polishing rate by CMP, it is regarded as effective to add a metal oxide solubilizer after the surface of an aluminum film is oxidized by an oxidizing agent. This can be interpreted that when an oxide on the aluminum film surface shaven off by an abrasive is dissolved in a polishing slurry, the shaving effect of the abrasive is increased. As the metal oxide solubilizer, substances having a chelating ability with aluminum are useful, organic acids and inorganic acids are commonly used. As a result of the eager investigation by the inventors of the present invention regarding the organic acids and inorganic acids, it was found that a polyvalent carboxylic acid having a first stage acid dissociation exponent at 25° C. of 3 or less has high effect of improving the polishing rate for an aluminum film.

Examples of the oxidizing agent used in the invention include hydrogen peroxide; peracetic acid, perbenzoic acid, tert-butylhydroperoxide, potassium permanganate, potassium dichromate, potassium iodate, potassium periodate, nitric acid, ferric nitrate, perchlorine acid, hypochlorous acid, potassium ferricyanide, ammonium persulfate, and ozone water. Among them, hydrogen peroxide, nitric acid, potassium periodate, hypochlorous acid, and ozone water are preferable, and hydrogen peroxide is particularly preferable. These oxidizing agents may be used alone or in combination of two or more. When the substrate is a silicon substrate containing integrated circuit elements, it is undesirable that the substrate is contaminated by an alkali metal, alkaline earth metal, halide or the like. Therefore an oxidizing agent containing no nonvolatile component is preferable. When the substrate to be applied is a glass substrate or the like containing no semiconductor element, the oxidizing agent may contain nonvolatile components.

The blending quantity of the oxidizing agent in the polishing slurry for polishing an aluminum film is preferably in the range of 0.1 to 50% by weight, and more preferably in the range of 0.3 to 40% by weight relative to the total weight of the polishing slurry. When the blending quantity is less than 0.1% by weight, the polishing rate of an aluminum film tends to be insufficient, and when exceeding 50% by weight, the polishing rate tends to be not improved.

In the invention, colloidal silica is used as the abrasive. Since colloidal silica is superior in smoothing the surface of an aluminum film, the polishing slurry comprising colloidal silica can achieve the object of the invention. The average particle diameter of the secondary particles of the colloidal silica is preferably in the range of 5 to 100 nm, and more preferably in the range of 10 to 90 nm. When the average particle diameter of the secondary particles is less than 5 nm, the polishing rate of an aluminum film tends to be insufficient, and when the average particle diameter of the secondary particles exceeds 100 nm, the smoothness of the polished aluminum film surface tends to be insufficient. The average particle diameter of the secondary particles can be determined by centrifuging the polishing slurry for 10 minutes at a rotation speed of 8000 $min^{-1}$, and measuring the supernatant solution with a zeta potential and particle diameter measurement apparatus (trade name: ZETASIZER 3000HS, manufactured by Malvern Instruments Ltd.).

Examples of the colloidal silica which can be used include colloidal silica synthesized by a fumed method in which silicon chloride or the like is reacted with oxygen and hydrogen in a vapor phase, a sol-gel method in which alkoxysilane such as tetraethoxysilane is condensed by hydrolysis, or an inorganic colloid method in which impurities are removed by purification. In particular, it is preferable to use colloidal silica synthesized by a sol-gel method in which colloidal silica is synthesized by hydrolysis condensation of alkoxysilane such as tetraethoxysilane. Further, the colloidal silica is preferably of high purity for avoiding contamination of the aluminum surface. Specifically, the sodium content of the colloidal silica is preferably 10 ppm or less, more preferably 8 ppm or less, and most preferably 5 ppm or less. When the sodium content exceeds 10 ppm, in cases where the colloidal silica is used as a CMP slurry, the aluminum surface may be contaminated by the sodium.

The blending quantity of the colloidal silica in the polishing slurry for polishing an aluminum film is preferably in the range of 0.01 to 10% by weight, and more preferably in the range of 0.05 to 5% by weight relative to the total weight of the polishing slurry. When the blending quantity is less than 0.01% by weight, the polishing rate with the polishing slurry tends to be not significantly different from that with a polishing slurry containing no colloidal silica, and when exceeding 10% by weight, the polishing rate tends to be not improved.

The polishing slurry of the invention is a slurry dispersion of colloidal silica in water. The blending quantity of water is the remainder to the total amount of various components (polyvalent carboxylic acid, oxidizing agent, colloidal silica, and other optional additives).

The pH of the polishing slurry of the invention for polishing an aluminum film is in the range of 2 to 4, preferably in the range of 2.1 to 3.8, and more preferably in the range of 2.2 to 3.7. When the pH is less than 2, operability may be poor because the piping system of the polishing apparatus is damaged, and when the pH exceeds 4, the smoothness of the polished aluminum film may be deteriorated, or the storage stability of the polishing slurry may be impaired. The pH of the polishing slurry is adjusted within the above range by, for example, a method of adjusting the addition amount of the above-described polyvalent carboxylic acid, or a method of adding an alkali component such as ethylene diamine, ethanolamine, ammonia, sodium hydroxide, potassium hydroxide, or tetramethylammonium hydroxide. In usual cases, the pH is adjusted by adding an inorganic base such as ammonia.

To the polishing slurry of the invention, in addition to the above-described various components, a coloring agent such as a dye or pigment, a solvent compatible with water, water-soluble polymer, and other additives which are commonly added to a polishing material may be added within the range which does not impair the effect of the polishing slurry.

The polishing method of the invention for an aluminum film comprises pressing a substrate having an aluminum film formed thereon against a polishing cloth on a polishing table, and moving the substrate and the polishing table while the polishing slurry of the invention for polishing an aluminum film is supplied between the aluminum film and the polishing cloth, thereby polishing the aluminum film.

Examples of the substrate having an aluminum film formed thereon which is to be polished in the invention include substrates related to the manufacture of a semiconductor apparatus such as a semiconductor substrate in a stage in which circuit elements and a wiring pattern have been formed, or a semiconductor substrate in a stage in which circuit elements have been formed.

In the polishing method of the invention for an aluminum film, the polishing apparatus to be used may be a common polishing apparatus having a holder for holding a substrate and a table to which a polishing cloth (pad) is attached (equipped with a motor or the like capable of changing the rotation number), and is not particularly limited. For example, FACT-200, a polishing apparatus manufactured by Nano Factor Co., Ltd., can be used.

Examples of the polishing cloth include common non-woven fabric, foamed polyurethane, and porous fluorocarbon resins, and are not particularly limited. The polishing cloth is preferably groove-processed for retaining the polishing slurry for polishing an aluminum film.

Further, the polishing conditions are not limited, but the rotation rate of the table is preferably as low as 200 $min^{-1}$ or less in order to prevent the substrate from jumping out, and the pressure to be applied to the substrate is preferably 1 $kg/cm^2$ (98 kPa) or less in order to prevent the development of scratches on the polished surface of an aluminum film on the substrate.

The method for supplying the polishing slurry of the invention for polishing an aluminum film to the polishing apparatus is not particularly limited as long as the polishing slurry can be continuously supplied to the polishing cloth with a pump or the like during polishing. The amount of the polishing slurry to be supplied is not particularly limited, but is preferably in an amount so that the surface of the polishing cloth is constantly covered with the polishing slurry. Specifically, it is preferable that 0.001 to 1 mL of the polishing slurry is supplied per 1 $cm^2$ of the polishing cloth area.

For moving the substrate and the polishing table with an aluminum film on the substrate pressed against the polishing cloth, specifically, at least either of the substrate or the polishing table is moved. Polishing may be performed by rotating the polishing table, or by rotating or shaking the holder. Other examples of the method include a polishing method of planet rotating the polishing table, and a polishing method of linearly moving a belt-form polishing cloth in one longitudinal direction. The holder may be either in a fixed, rotated, or shaken condition. These polishing methods can be selected as appropriate according to the polishing apparatus or the like.

The substrate after completion of polishing is preferably thoroughly washed in running water, and dried after knocking off water droplets adhering to the substrate using a spin dryer or the like.

The surface of an aluminum film can be smoothly and quickly polished by polishing the substrate having an aluminum film formed thereon using the polishing slurry of the invention for polishing an aluminum film. The polishing slurry of the invention for polishing an aluminum film enables polishing at a polishing rate of 25 nm/min or more, and with an average surface roughness (Ra) of 1 nm or less. In the invention, the index of the smoothness after completion of polishing is the average surface roughness (Ra) of the aluminum film surface, which was determined by measuring the aluminum film surface with a scanning probe microscope (SPI3800N/SPA500, manufactured by Seiko Instruments, Inc.), in a measurement area of 5 micron square. The polishing rate was calculated from the polishing time and the difference in the thickness of the aluminum film on the substrate between before and after polishing, which had been converted from the sheet resistance value.

The polishing slurry of the invention for polishing an aluminum film is particularly suitable for polishing an aluminum film for LSI, and may be used for polishing aluminum films for other applications.

EXAMPLES

The invention is further illustrated by following Examples. The invention is not limited to these Examples.

Example 1

0.47% by weight of oxalic acid dihydrate (0.00373 mol relative to 100 g of the total amount of the polishing slurry) was dissolved in water, subsequently 5% by weight of 20% by weight colloidal silica (1% by weight as solid content) having an average particle diameter of secondary particles of 50 nm was dispersed therein, 10% by weight of 30% hydrogen peroxide water was added, and then the pH was adjusted to 2.5 with 25% by weight ammonia water, thus a polishing slurry for polishing an aluminum film (A) was prepared.

The colloidal silica was prepared, in accordance with a common procedure, by hydrolysis of tetraethoxysilane in an ammonia solution.

Subsequently, the polishing slurry for polishing an aluminum film (A) obtained as described above was dropped to a pad attached to a table, and CMP treatment was performed under the polishing conditions as described below, and the evaluations described below were performed. The results of the evaluations are shown in Table 1.

(Polishing Conditions)

Polishing apparatus: FACT-200 manufactured by Nano Factor Co., Ltd.

Polishing pad: Closed-cell foamed polyurethane resin
Polishing pressure: 30 kPa (300 $gf/cm^2$)
Rotation rate of polishing table: 50 $min^{-1}$
Flow rate of polishing slurry: 11 cc/min
Polishing time: 1 minute
(Substrate Used)
A silicon substrate (2 cm square) having an aluminum film formed thereon with a thickness of 2.4 μm
Average surface roughness (Ra) before polishing: 3.1 nm
(Evaluation Items and Evaluation Methods)
Polishing rate of aluminum film by CMP: The polishing rate was calculated from the polishing time and the difference in the thickness of the aluminum film on the substrate between before and after polishing, which had been converted from the sheet resistance value.

Average surface roughness: The average surface roughness of the polished aluminum film was determined by measuring the surface with a scanning probe microscope (SPI3800N/SPA500, manufactured by Seiko Instruments, Inc.) in a measurement area of 5 micron square.

The results of the evaluations indicate that the polishing rate of the aluminum film was 65 nm/min and the average surface roughness (Ra) was 0.4 nm, and that high-speed polishing and favorable smoothness were achieved.

Example 2

A polishing slurry for polishing an aluminum film (B) was prepared in the same procedure as Example 1 except that no hydrogen peroxide water was added.

Subsequently, polishing was performed using the polishing slurry for polishing an aluminum film (B) obtained as described above and evaluation was performed in the same manner as Example 1. The results of the evaluations indicate that the polishing rate of the aluminum film was 63 nm/min and the average surface roughness (Ra) was 0.4 nm, and that high-speed polishing and favorable smoothness were achieved.

Example 3

A polishing slurry for polishing an aluminum film (C) was prepared in the same procedure as Example 1 except that 3% by weight of 30% hydrogen peroxide water was used.

Subsequently, polishing was performed using the polishing slurry for polishing an aluminum film (C) obtained as described above and evaluation was performed in the same manner as Example 1. The results of the evaluations indicate that the polishing rate of the aluminum film was 63 nm/min and the average surface roughness (Ra) was 0.4 nm, and that high-speed polishing and favorable smoothness were achieved.

Example 4

A polishing slurry for polishing an aluminum film (D) was prepared in the same procedure as Example 1 except that 0.56% by weight tartaric acid (0.00373 mol relative to 100 g of the total amount of the polishing slurry) was used in place of 0.47% by weight of oxalic acid dehydrate.

Subsequently, polishing was performed using the polishing slurry for polishing an aluminum film (D) obtained as described above and evaluation was performed in the same manner as Example 1. The results of the evaluations indicate that the polishing rate of the aluminum film was 32 nm/min and the average surface roughness (Ra) was 0.6 nm, and that high-speed polishing and favorable smoothness were achieved.

Example 5

A polishing slurry for polishing an aluminum film (E) was prepared in the same procedure as Example 1 except that 0.39% by weight of malonic acid (0.00375 mol relative to 100 g of the total amount of the polishing slurry) was used in place of 0.47% by weight of oxalic acid dehydrate.

Subsequently, polishing was performed using the polishing slurry for polishing an aluminum film (E) obtained as described above and evaluation was performed in the same manner as Example 1. The results of the evaluations indicate that the polishing rate of the aluminum film was 41 nm/min and the average surface roughness (Ra) was 0.6 nm, and that high-speed polishing and favorable smoothness were achieved.

Example 6

A polishing slurry for polishing an aluminum film (F) was prepared in the same procedure as Example 1 except that 5% by weight of 20% by weight colloidal silica (1% by weight as solid content) having an average particle diameter of secondary particles of 80 nm was used in place of 5% by weight of 20% by weight colloidal silica having an average particle diameter of secondary particles of 50 nm.

Subsequently, polishing was performed using the polishing slurry for polishing an aluminum film (F) obtained as described above and evaluation was performed in the same manner as Example 1. The results of the evaluations indicate that the polishing rate of the aluminum film was 67 nm/min and the average surface roughness (Ra) was 0.8 nm, and that high-speed polishing and favorable smoothness were achieved.

Example 7

A polishing slurry for polishing an aluminum film (G) was prepared in the same procedure as Example 6 except that no hydrogen peroxide water was added.

Subsequently, polishing was performed using the polishing slurry for polishing an aluminum film (G) obtained as described above and evaluation was performed in the same manner as Example 1. The results of the evaluations indicate that the polishing rate of the aluminum film was 70 nm/min and the average surface roughness (Ra) was 0.8 nm, and that high-speed polishing and favorable smoothness were achieved.

Example 8

A polishing slurry for polishing an aluminum film (H) was prepared using the same components as Example 1, wherein the pH was adjusted to 3.0 by controlling the addition amount of ammonia water.

Subsequently, polishing was performed using the polishing slurry for polishing an aluminum film (H) obtained as described above and evaluation was performed in the same manner as Example 1. The results of the evaluations indicate that the polishing rate of the aluminum film was 64 nm/min and the average surface roughness (Ra) was 0.8 nm, and that high-speed polishing and favorable smoothness were achieved.

Comparative Example 1

A polishing slurry for polishing an aluminum film (I) was prepared in the same procedure as Example 1 except that 0.5% by weight of malic acid (0.00373 mol relative to 100 g of the total amount of the polishing slurry) in place of 0.47% by weight of oxalic acid dihydrate.

Subsequently, polishing was performed using the polishing slurry for polishing an aluminum film (I) obtained as described above and evaluation was performed in the same manner as Example 1. The results of the evaluations indicate that the polishing rate of the aluminum film was 15 nm/min and the average surface roughness (Ra) was 0.6 nm, and that favorable smoothness was achieved, but the polishing rate was significantly lower in comparison with that in Examples 1 through 8.

Comparative Example 2

A polishing slurry for polishing an aluminum film (J) was prepared using the same components as Example 1, wherein the pH was adjusted to 5.0 by controlling the addition amount of ammonia water.

Subsequently, polishing was performed using the polishing slurry for polishing an aluminum film (J) obtained as described above and evaluation was performed in the same manner as Example 1. The results of the evaluations indicate that the polishing rate of the aluminum film was 64 nm/min and the average surface roughness (Ra) was 1.4 nm, and that high-speed polishing was achieved, but the smoothness of the aluminum film surface was significantly worse in comparison with that in Examples 1 through 8.

Comparative Example 3

A polishing slurry for polishing an aluminum film (K) was prepared in the same procedure as Example 1 except that 5% by weight of a 20% by weight fumed silica suspension having an average particle diameter of 160 nm (1% by weight as solid content) was used in place of 5% by weight of 20% by weight colloidal silica having an average particle diameter of 50 nm. The fumed silica suspension was prepared by suspending AEROSIL 200 (manufactured by Nippon Aerosil Co., Ltd.) in pure water, and ultrasonically dispersing therein.

Subsequently, polishing was performed using the polishing slurry for polishing an aluminum film (K) obtained as described above and evaluation was performed in the same manner as Example 1. The results of the evaluations indicate that the polishing rate of the aluminum film was 89 nm/min and the average surface roughness (Ra) was 1.6 nm, and that high-speed polishing was achieved, but the smoothness of the aluminum film surface was significantly worse in comparison with that in Examples 1 through 8.

Comparative Example 4

A polishing slurry for polishing an aluminum film (L) was prepared in the same procedure as Example 1 except that 0.52% of bromoacetic acid (0.00374 mol relative to 100 g of the total amount of the polishing slurry) was used in place of 0.47% by weight of oxalic acid dihydrate.

Subsequently, polishing was performed using the polishing slurry for polishing an aluminum film (L) obtained as described above and evaluation was performed in the same manner as Example 1. The results of the evaluations indicate that the polishing rate of the aluminum film was 18 nm/min and the average surface roughness (Ra) was 0.8 nm, and that favorable smoothness was achieved, but the polishing rate was significantly lower in comparison with that in Examples 1 through 8.

Tables 1 and 2 show the composition and polishing evaluations of the polishing slurries related to above Examples 1 through 8, and Comparative Examples 1 through 4, respectively. In Tables 1 and 2, the concentration (% by weight) of the abrasive, organic acid, and oxidizing agent refers to the concentration of the components relative to the total weight of the polishing slurry.

[Table 1]

[Table 2]

It will be understood by those skilled in the art that those described above are preferable embodiments of the invention, and many modifications and corrections can be made without departing from the spirit and scope of the invention.

The invention claimed is:

1. A polishing slurry consisting of a polyvalent carboxylic acid having a first stage acid dissociation exponent at 25° C. of 3 or lower, colloidal silica, and water, and having a pH from 2 to 4, wherein said polishing slurry is capable of polishing an aluminum film.

2. The polishing slurry according to claim 1, wherein the polyvalent carboxylic acid is at least one selected from oxalic acid, malonic acid, and tartaric acid.

3. The polishing slurry according to claim 1, wherein the average particle diameter of the secondary particles of the colloidal silica is from 5 to 100 nm.

4. A method for polishing an aluminum film comprising pressing a substrate having an aluminum film formed thereon against a polishing cloth on a polishing table, and moving the substrate and the polishing table while the polishing slurry for polishing an aluminum film according to claim 1 is supplied between the aluminum film and the polishing cloth, thereby polishing the aluminum film.

5. A method for polishing an aluminum film comprising pressing a substrate having an aluminum film formed thereon against a polishing cloth on a polishing table, and moving the substrate and the polishing table while the polishing slurry according to claim 2 is supplied between the aluminum film and the polishing cloth, thereby polishing the aluminum film.

6. A method for polishing an aluminum film comprising pressing a substrate having an aluminum film formed thereon against a polishing cloth on a polishing table, and moving the substrate and the polishing table while the polishing slurry according to claim 3 is supplied between the aluminum film and the polishing cloth, thereby polishing the aluminum film.

7. A polishing slurry consisting of an oxidizing agent, a polyvalent carboxylic acid having a first stage acid dissociation exponent at 25° C. of 3 or lower, colloidal silica, and water, and having a pH from 2 to 4, wherein said polishing slurry is capable of polishing an aluminum film.

8. The polishing slurry according to claim 7, wherein the oxidizing agent is at least one selected from hydrogen peroxide, nitric acid, potassium periodate, hypochlorous acid, and ozone water.

9. The polishing slurry according to claim 7, wherein the average particle diameter of the secondary particles of the colloidal silica is from 5 to 100 nm.

10. A method for polishing an aluminum film comprising pressing a substrate having an aluminum film formed thereon against a polishing cloth on a polishing table, and moving the substrate and the polishing table while the polishing slurry according to claim 7 is supplied between the aluminum film and the polishing cloth, thereby polishing the aluminum film.

11. A method for polishing an aluminum film comprising pressing a substrate having an aluminum film formed thereon against a polishing cloth on a polishing table, and moving the substrate and the polishing table while the polishing slurry according to claim 8 is supplied between the aluminum film and the polishing cloth, thereby polishing the aluminum film.

12. A method for polishing an aluminium film comprising pressing a substrate having an aluminium film formed thereon against a polishing cloth on a polishing table, and moving the substrate and the polishing table while the polishing slurry according to claim 9 is supplied between the aluminium film and the polishing cloth, thereby polishing the aluminum film.

* * * * *